(12) United States Patent
Ge et al.

(10) Patent No.: US 10,026,894 B2
(45) Date of Patent: Jul. 17, 2018

(54) MEMRISTORS WITH OXIDE SWITCHING LAYERS

(71) Applicant: HEWLETT-PACKARD DEVELOPMENT COMPANY, L.P., Houston, TX (US)

(72) Inventors: Ning Ge, Palo Alto, CA (US); Jianhua Yang, Palo Alto, CA (US); Zhiyong Li, Foster City, CA (US); Minxian Zhang, Mountain View, CA (US); Katy Samuels, Palo Alto, CA (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 15/512,141

(22) PCT Filed: Sep. 30, 2014

(86) PCT No.: PCT/US2014/058148
§ 371 (c)(1),
(2) Date: Mar. 17, 2017

(87) PCT Pub. No.: WO2016/053262
PCT Pub. Date: Apr. 7, 2016

(65) Prior Publication Data
US 2017/0279044 A1    Sep. 28, 2017

(51) Int. Cl.
*H01L 45/00* (2006.01)
*B41J 2/175* (2006.01)

(52) U.S. Cl.
CPC ........ *H01L 45/1233* (2013.01); *B41J 2/1753* (2013.01); *H01L 45/1253* (2013.01); *H01L 45/146* (2013.01); *H01L 45/1633* (2013.01)

(58) Field of Classification Search
CPC ................. H01L 45/1233; H01L 45/1253; H01L 45/146
See application file for complete search history.

(56) References Cited

U.S. PATENT DOCUMENTS

| | | | |
|---|---|---|---|
| 7,306,988 B1 | 12/2007 | Avanzino et al. | |
| 7,629,198 B2 * | 12/2009 | Kumar | H01L 45/145 257/4 |

(Continued)

FOREIGN PATENT DOCUMENTS

| | | |
|---|---|---|
| CN | 103367639 A | 10/2013 |
| CN | 103922798 A | 7/2014 |
| JP | 2009-071304 | 4/2009 |

OTHER PUBLICATIONS

Wu et al., Resistive switching of thin AlOx and Cu-doped-AlOx films, Jun. 11, 2013, Thin Solid Films, 544 (2013) 24-27.*

(Continued)

*Primary Examiner* — Allison P Bernstein
(74) *Attorney, Agent, or Firm* — HP Inc. Patent Department

(57) ABSTRACT

An example memristor includes a first conductive layer, a switching layer, and a second conductive layer. The first conductive layer may include a first conductive material and a second conductive material. The second conductive material may have a higher diffusivity than the first conductive material. The switching layer may be coupled to the first conductive layer and may include a first oxide having the first conductive material and a second oxide having the second conductive material. The second conductive layer may be coupled to the switching layer.

19 Claims, 3 Drawing Sheets

(56) References Cited

U.S. PATENT DOCUMENTS

| | | |
|---|---|---|
| 8,116,116 B2 | 2/2012 | Hwang et al. |
| 8,735,245 B2 | 5/2014 | Lv et al. |
| 2008/0220601 A1 | 9/2008 | Kumar et al. |
| 2010/0085142 A1 | 4/2010 | Hosoi |
| 2010/0233849 A1 | 9/2010 | Lee et al. |
| 2011/0080766 A1 | 4/2011 | Chang et al. |
| 2012/0281452 A1 | 11/2012 | Huo et al. |
| 2013/0106930 A1 | 5/2013 | Lea et al. |
| 2013/0217199 A1 | 8/2013 | Huang et al. |

OTHER PUBLICATIONS

Lv, H. et al., The Role of CuAlO Interface Layer for Switching Behavior of Al/CuxO/Cu Memory Device, Dec. 2010, IEEE Electron Device Letters, vol. 31, No. 12, pp. 1464-1466.
Yin, M. et al., Enhancement of Endurance for CuxO Based RRAM Cell, Oct. 20-23, 2008, IEEE, 4 pages.
Korean Intellectual Property Office, International Search Report and Written Opinion for PCT/US2014/058148 dated Jun. 30, 2015 (11 pages).

\* cited by examiner

MEMRISTORS WITH OXIDE SWITCHING LAYERS

BACKGROUND

Printers can have printheads capable of depositing ink on a substrate. Printheads can include devices to store data. Memristors are devices that can be programmed to different resistive states by applying a programming energy, such as a voltage. After programming, the state of the memristor can be read and remains stable over a specified time period. Thus, memristors can be used to store digital data. For example, a high resistance state can represent a digital "0" and a low resistance state can represent a digital "1." Large crossbar arrays of memristive elements can be used in a variety of applications, including non-volatile memory and other applications.

BRIEF DESCRIPTION OF THE DRAWINGS

The following detailed description references the drawings, wherein.

DETAILED DESCRIPTION

Imaging devices may include printheads, which may have memory devices to store data. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others. EPROM has been incorporated into some printheads. However, with an increase in counterfeiting activity, more secure authentication and anti-counterfeit tools having a greater storage capacity are sought. Furthermore, as new technologies are developed, demand for space on circuit boards is at a premium.

Memristors have been proposed to be used in printheads. Memristors are devices that may be used as components in a wide range of electronic circuits, such as memories, switches, radio frequency circuits, and logic circuits and systems. In a memory structure, a crossbar array of memory devices having memristors may be used. When used as a basis for memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("ON") and one in which the channel forms a less conductive path ("OFF"). In some other cases, conductive paths represent "OFF" and less conductive paths represent "ON". However, current proposed solutions present certain challenges, including inconsistent switching behavior and undesirable electrical conductivity in some implementations.

Examples herein provide for memristors with oxide switching layers. In example implementations, a memristor with an oxide switching layer has a first conductive layer with a first conductive material and a second conductive material, a switching layer with a first oxide having the first conductive material and a second oxide having the second conductive material, and a second conductive layer. The presence of the second oxide in the switching layer may alter the electrical properties of the switching layer to more desirable levels. Furthermore, the first oxide and the second oxide may be formed by oxidizing the materials of the first conductive layer, which allows an effective and efficient mechanism to introduce two oxides in a single switching layer.

Figure 1:
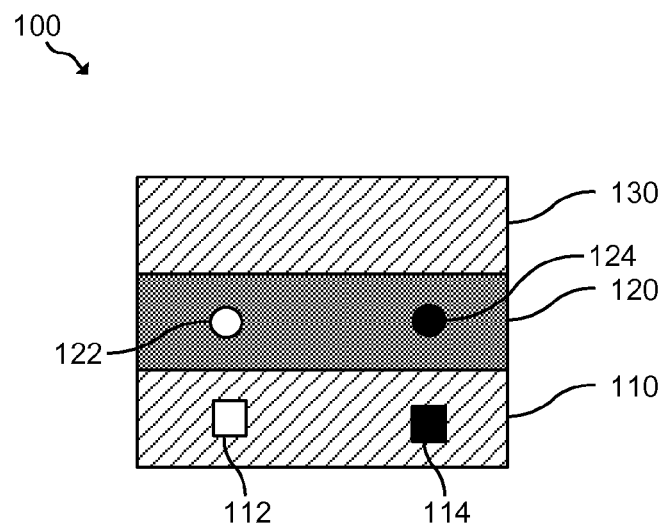
FIG. 1 is a cross-sectional view of an example memristor with an oxide switching layer.

Referring now to the figures, FIG. 1 depicts an example memristor 100 with an oxide switching layer 120. Memristor 100 may have a first conductive layer 110, switching layer 120, and a second conductive layer 130. First conductive layer 110 may have a first conductive material 112 and a second conductive material 114. Switching layer 120 may be coupled to first conductive layer 110 and may include a first oxide 122 having first conductive material 112 and a second oxide 124 having second conductive material 114. Second conductive layer 130 may be coupled to switching layer 120.

Memristor 100 may be an electrical device or component that has a resistance that changes with an applied electrical stimulus, such as current or voltage, across or through memristor 100. Furthermore, memristor 100 may "memorize" its last resistance. In this manner, memristor 100 may be set to at least two states. Memristor 100 may be one of many devices in a larger structure, such as a crossbar array, which is further discussed below in relation to FIG. 2. An array of multiple memristors 100 may be utilized, for example, in nonvolatile resistive memories for use in such applications as printheads.

First conductive layer 110 may be relatively electrically conducting. First conductive layer 110 may be nonhomogeneous and may have first conductive material 112 and second conductive material 114. While FIG. 1 represents first conductive material 112 and second conductive material 114 as squares, it should be noted that it is no limitation on the materials, which may be of various shapes and structures. First conductive layer 110 may be a first electrode to conduct electricity to or from switching layer 120.

First conductive layer 110 may include a variety of materials for first conductive material 112 and second conductive material 114. For example, first conductive material 112 and second conductive material 114 may be different metals that form a metallic mixture making up first conductive layer 110. Non-limiting example materials for first conductive material 112 include Si, Al, Ga, Mg, Ca, Sr, Ba, Sc, Y, Zr, Hf, Ti, Ta, W, Mo, Nb, V, Mn, Cr, Sm, Gd, Dy, Ho, Er, Yb, Lu. Non-limiting example materials for second conductive material 114 include Cu, Ni, Ag, Au, Pt, Pd, Zn. In some particular examples, first conductive layer 110 may include an alloy having aluminum as first conductive material 112 and copper as second conductive material 114.

Second conductive material 114 may have a higher diffusivity than first conductive material 112 with respect to another material, such as the materials of switching layer 120 as described further below. As used herein, diffusivity refers to a material's propensity to diffuse into another material. For example, the higher the diffusivity for a first material with respect to a second material, the faster first material will diffuse into the second. Accordingly, in some examples, second conductive material 114 will have a higher diffusion rate into switching layer 120 than first conductive material 112. Further details are described below in relation to switching layer 120.

Furthermore, in some examples, first conductive layer 110 may include additional materials in addition to first conductive material 112 and second conductive material 114. The presence of other materials may provide additional beneficial properties. For example, first conductive layer 110 may have silicon, which may improve the properties of the layer or may provide additional materials from which oxides may be formed for switching layer 120, as described in detail below. The relative amounts of first conductive material 112, second conductive material 114, and other materials may vary. In some examples, first conductive material 112 may be present in relatively large quantities, such as making up a majority of the composition of first conductive layer 110. In such examples, second conductive material 114 and other materials may form relatively small percentages of the composition of first conductive layer 110.

Switching layer 120 may be the active region within memristor 100 that provides the memristive properties of memristor 100. Switching layer 120 may include first oxide 122 containing first conductive material 112 and second oxide 124 containing second conductive material 114. While FIG. 1 represents first oxide 122 and second oxide 124 as circles, it should be noted that it is no limitation on the materials, which may be of various shapes and structures.

In some implementations, first oxide 122 may have an oxidized portion of first conductive material 112 of first conductive layer 110. For example, first oxide 122 may have been formed by the oxidation of a part of first conductive material 112 in first conductive layer 110. In some examples, first conductive layer 110 having first conductive material 112 may be formed first. Then, switching layer 120 may be formed by oxidizing a part of first conductive material 112 to form first oxide 122. For example, switching layer 120 may be formed by using thermal oxidation to produce first oxide 122 from first conductive material 112 of first conductive layer 110.

Similarly in some examples, second oxide 124 may have an oxidized portion of second conductive material 114 of first conductive layer 110. For example, second oxide 124 may have been formed by the oxidation of a part of second conductive material 114 in first conductive layer 110. In some examples, first conductive layer 110 having second conductive material 114 may be formed first. Then, switching layer 120 may be formed by oxidizing a part of second conductive material 114 to form second oxide 124. For example, switching layer 120 may be formed by using thermal oxidation to produce second oxide 124 from second conductive material 114 of first conductive layer 110.

Additionally or as an alternative, second oxide 124 may have a diffused portion of second conductive material 114 of first conductive layer 110. For example, a part of second oxide 124 may have been formed by diffusion of a part of second conductive material 114 in first conductive layer 110 into switching layer 120. In some implementations, after the formation of switching layer 120, such as by oxidation or thermal oxidation as described above, a portion of second conductive material 114 may diffuse into switching layer 120, which may already have various materials including first oxide 122 and second oxide 124. In some examples, a portion of second conductive material 114 that diffuse into switching layer 120 may oxidize to form second oxide 124.

As described, first oxide 122 and second oxide 124 may include a variety of materials. Furthermore, switching layer 120 may include additional materials in addition to first oxide 122 and second oxide 124. The presence of other materials may provide additional beneficial properties. For example, switching layer 120 may have silicon oxide, which may improve the properties of the layer. As a specific example, switching layer 120 may include aluminum oxide as first oxide 122, copper oxide as second oxide 124, and silicon oxide. The relative amounts of first oxide 122, second oxide 124, and other materials may vary. In some examples, first oxide 122 may be present in relatively large quantities, such as making up a majority of the composition of switching layer 120. In such examples, second oxide 124 and other materials may form relatively small percentages of the composition of switching layer 120.

Second conductive layer 130 may be relatively electrically conducting. Second conductive layer 130 may be a second electrode to conduct electricity to or from switching layer 120. Second conductive layer 130 may include a variety of materials. Non-limiting example materials for second conductive layer 130 may include Pt, Ta, Hf, Zr, Al, Co, Ni, Fe, Nb, Mo, W, Cu, Ti, TiN, TaN, $Ta_2N$, $WN_2$, NbN, MoN, $TiSi_2$, TiSi, $Ti_5Si_3$, $TaSi_2$, $WSi_2$, $NbSi_2$, $V_3Si$, electrically doped polycrystalline Si, electrically doped polycrystalline Ge, and combinations thereof.

Figure 2:
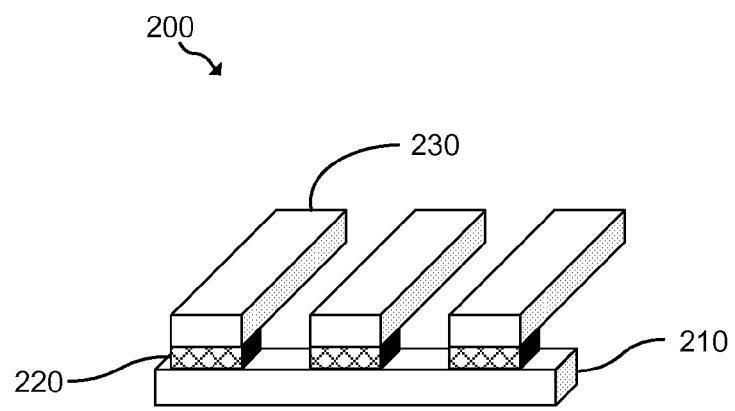
FIG. 2 is a diagram of an example crossbar array having memristors with oxide switching layers.

FIG. 2 depicts an example crossbar array 200 having memristors with oxide switching layers. Crossbar array 200 may have at least one first electrode 210, a plurality of oxide switching layers 220, and at least one second electrode 230. Crossbar array 200 may be a structure to organize oxide switching layers 220 between first electrode 210 and second electrode 230. Such as structure may provide a high density of memristors that may serve, for example, as individual memory cells within a crossbar memory structure.

Similar to first conductive layer 110 of memristor 100 depicted in FIG. 1, first electrode 210 may have an electrically conductive material that conducts electrical stimulus, such as current, to and from switching layers 220 that are coupled to first electrode 210. First electrode 210 may have various materials, including a first conductive material and a second conductive material. The plurality of oxide switching layers 220 may be coupled to first electrode 220, and each oxide switching layer 220 may include a first oxide having the first conductive material and a second oxide having the second conductive material. In some examples, the first oxide and the second oxide may include oxidized portions of the first conductive material and the second conductive material of first electrode 210, respectively. Furthermore, in some examples, the second oxide may include diffused portions of the second conductive material of first electrode 210. Second electrode 230 may conduct electrical stimulus, such as current, to and from oxide switching layers 220, and may be similar to second conductive layer 130 of FIG. 1.

Figure 3:
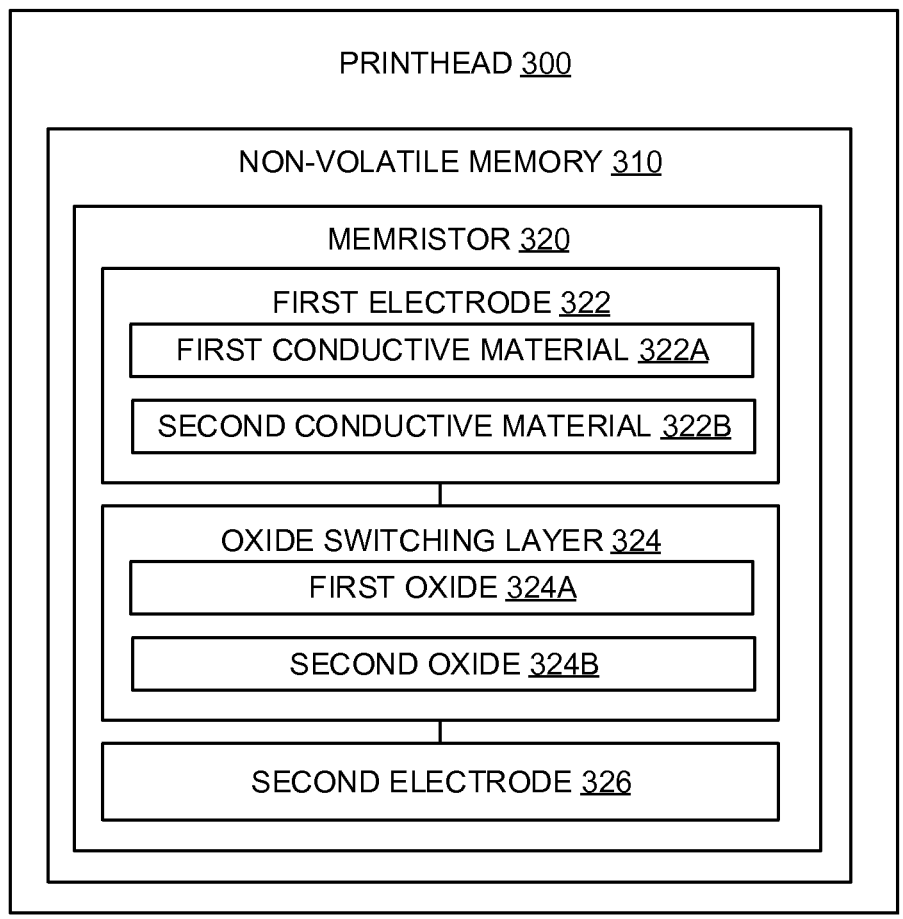
FIG. 3 is a block diagram of an example printhead having non-volatile memory which has memristors with oxide switching layers.

FIG. 3 depicts an example printhead 300 having a non-volatile memory 310 which has a memristor 320 with an oxide switching layer 324. Printhead 300 may be a component or device, often used in printers or printing assemblies, that may assemble and hold characters and from which the images of the characters may be transferred to a printing medium.

Non-volatile memory 310 may be used to store any type of data. In some examples, non-volatile memory 310 may store one or more of ink supply specific data, ink identification data, ink characterization data, and ink usage data. Additionally or as an alternative, non-volatile memory 310 may store one or more of printhead specific data, printhead identification data, warranty data, printhead characterization data, printhead usage data, authentication data, and anti-counterfeiting data (ACF). In a number of examples, non-volatile memory 310 may be written to at the time of manufacturing or during the operation of printhead 300.

Non-volatile memory 310 may include at least one memristor 320 to store data. Each memristor 320 may include a first electrode 322 and a second electrode 326. First electrode 322 may have a first conductive material 322A and a second conductive material 322B. Oxide switching layer 324 may be coupled to first electrode 322. Oxide switching layer 324 may have a resistance that changes with an applied electrical stimulus, such as current or voltage, across or through oxide switching layer 324. Furthermore, oxide switching layer 324 may "memorize" its last resistance. As described in detail above, oxide switching layer 324 may include a first oxide 324A that includes first conductive material 322A and a second oxide 324B that includes second conductive material 322B.

Figure 4:
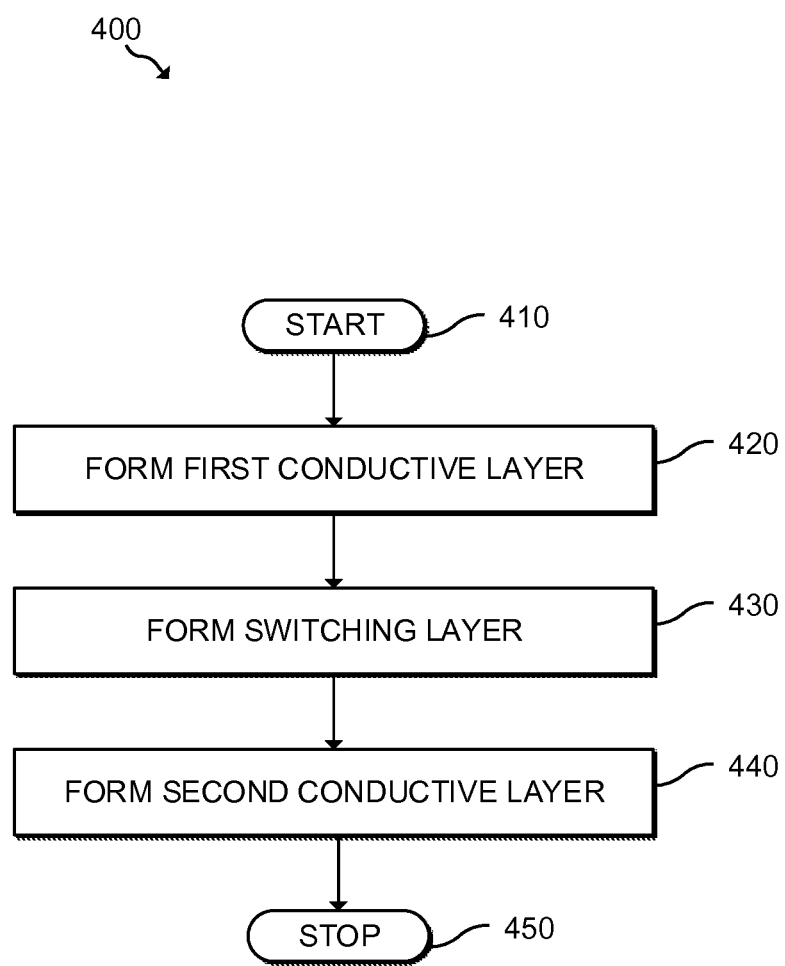
FIG. 4 is a flowchart of an example method for manufacturing a memristor with an oxide switching layer.

FIG. 4 is a flowchart depicting an example method 400 for manufacturing a memristor with an oxide switching layer. Method 400 may include block 420 for forming a first conductive layer, block 430 for forming a switching layer on the first conductive layer, and block 440 for forming a second conductive layer on the switching layer. Although execution of method 400 is described herein in reference to memristor 100 of FIG. 1, other suitable parties for implementation of method 400 should be apparent, including memristor 320 of FIG. 3.

Method 400 may start in block 410 and proceed to block 420, where first conductive layer 110 is formed. First conductive layer 110 may be an electrode that may serve as the connection for memristor 100 to other components. For example, first conductive layer 110 may connect memristor 100 to lines of a crossbar array. Conductive layer 110 may include first conductive material 112 and second conductive material 114, where second conductive material 114 may have a higher diffusivity than first conductive material 112. First conductive layer 110 may be formed by a variety of techniques. These techniques may include ion beam assisted deposition, sputtering, atomic layer deposition, evaporation, chemical vapor deposition, and physical vapor deposition. For example, first conductive layer 110 may be deposited onto a substrate such as a semi-conductor chip. As discussed above, first conductive layer 110 may have a variety of materials. In some implementations, first conductive material 112 is aluminum and second conductive material 114 is copper. In some implementations, first conductive layer 110 may include silicon.

After forming first conductive layer 110, method 400 may proceed to block 430, where switching layer 120 is formed on first conductive layer 110. Switching layer 120 may include first oxide 122 formed by thermally oxidizing a portion of first conductive material 112 of first conductive layer 110 and second oxide 124 formed by thermally oxidizing a portion of second conductive material 114. For example, switching layer 120 may be formed by running a thermal oxidation process to first conductive layer 110 so that a portion of first conductive material 112 oxidizes into first oxide 122 and that a portion of second conductive material 114 oxidizes into second oxide 124. Furthermore, additional materials of first conductive layer 110 may oxidize to form additional materials of switching layer 120. For example, a portion of the aluminum, copper, and silicon making up first conductive layer 110 may oxidize to form aluminum oxide, copper oxide, and silicon oxide, respectively, to make up switching layer 120.

Furthermore, in some examples, second oxide 124 may include a diffused portion of second conductive material 114. For example, a part of second oxide 124 may be formed by diffusion of a part of second conductive material 114 into switching layer 120. For example, after thermal oxidation as described above, a portion of second conductive material 114 may diffuse into switching layer 120, which may already have various materials including first oxide 122 and second oxide 124. In some examples, the portions of second conductive material 114 that diffuse into switching layer 120 may oxidize to form second oxide 124.

After forming switching layer 120, method 400 may proceed to block 440, where second conductive layer 130 is formed on switching layer 120. Similarly to first conductive layer 110, second conductive material 120 may be an electrode that may serve as the connection for memristor 100 to other components. For example, second conductive layer 120 may connect memristor 100 to lines of a crossbar array. After forming second conductive layer 130, method 400 may proceed to block 450 to stop.

The foregoing describes a number of examples for memristors with oxide switching layers. It should be understood that the memristors described herein may include additional components and that some of the components described herein may be removed or modified without departing from the scope of the memristors or their applications. It should also be understood that the components depicted in the figures are not drawn to scale and thus, the components may have different relative sizes with respect to each other than as shown in the figures.

What is claimed is:

1. A memristor, comprising:
   a first conductive layer, wherein the first conductive layer comprises a first conductive material and a second conductive material, wherein the second conductive material has a higher diffusivity than the first conductive material, wherein the first conductive material is aluminum, the second conductive material is copper, and the first conductive layer comprises silicon; and
   a switching layer coupled to the first conductive layer, wherein the switching layer comprises a first oxide having the first conductive material and a second oxide having the second conductive material, wherein the switching layer comprises aluminum oxide, copper oxide, and silicon oxide; and
   a second conductive layer coupled to the switching layer.

2. The memristor of claim 1, wherein the first oxide comprises an oxidized portion of the first conductive material of the first conductive layer, and the second oxide comprises an oxidized portion of the second conductive material of the first conductive layer.

3. The memristor of claim 2, wherein the first oxide comprise a thermally-oxidized portion of the first conductive material of the first conductive layer, and the second oxide comprises a thermally-oxidized portion of the second conductive material of the first conductive layer.

4. The memristor of claim 1, wherein the second oxide comprises a diffused portion of the second conductive material of the first conductive layer.

5. The memristor of claim 1, wherein the first conductive layer comprises a first electrode, and the second conductive layer comprises a second electrode.

6. The memristor of claim 1, wherein the silicon oxide in the switching layer is an oxidized portion of the silicon in the first conductive layer.

7. The memristor of claim 1, wherein the silicon oxide in the switching layer is a thermally oxidized portion of the silicon in the first conductive layer.

8. A printhead, comprising a non-volatile memory, wherein the non-volatile memory comprises a memristor, and the memristor comprises:
a first electrode, wherein the first electrode comprises a first conductive material and a second conductive material, wherein the second conductive material has a higher diffusivity than the first conductive material;
a switching layer coupled to the first electrode, wherein the switching layer comprises a first oxide having the first conductive material, a second oxide having the second conductive material, and silicon oxide; and
a second electrode coupled to the switching layer,
wherein the first oxide comprises an oxidized portion of the first conductive material of the first electrode, and the second oxide comprises an oxidized portion of the second conductive material of the first electrode.

9. The printhead of claim 8, wherein the first conductive material is selected from the group consisting of Ga, Mg, Ca, Sr, Ba, Sc, Y, Zr, Hf, Ti, Ta, W, Mo, Nb, V, Mn, Cr, Sm, Gd, Dy, Ho, Er, Yb, Lu; and the second conductive material is selected from the group consisting of Ni, Ag, Au, Pt, Pd, Zn.

10. The printhead of claim 8, wherein the first oxide comprise a thermally-oxidized portion of the first conductive material of the first electrode, and the second oxide comprises a thermally-oxidized portion of the second conductive material of the first electrode.

11. The printhead of claim 8, wherein the first conductive material is selected from the group consisting of Si, Al, Ga, Mg, Ca, Sr, Ba, Sc, Y, Zr, Hf, Ti, Ta, W, Mo, Nb, V, Mn, Cr, Sm, Gd, Dy, Ho, Er, Yb, Lu; the second conductive material is selected from the group consisting of Cu, Ni, Ag, Au, Pt, Pd, Zn; and the first electrode comprises silicon.

12. The printhead of claim 8, wherein the second oxide comprises a diffused portion of the second conductive material of the first electrode.

13. The printhead of claim 8, wherein the first electrode further comprises a silicon.

14. The printhead of claim 13, wherein the silicon oxide in the switching layer is an oxidized portion of the silicon in the first electrode.

15. The printhead of claim 14, wherein the silicon oxide in the switching layer is a thermally oxidized portion of the silicon in the first electrode.

16. A method of manufacturing a memristor, comprising:
forming a first conductive layer, wherein the first conductive layer comprises a first conductive material, a second conductive material, and silicon, and wherein the second conductive material has a higher diffusivity than the first conductive material;
forming a switching layer on the first conductive layer, wherein the switching layer comprises a first oxide formed by thermally oxidizing a portion of the first conductive material of the first conductive layer, a second oxide formed by thermally oxidizing a portion of the second conductive material of the first conductive layer, and silicon oxide formed by thermally oxidizing the silicon of the first conductive layer; and
forming a second conductive layer on the switching layer.

17. The method of claim 16, wherein the first conductive material is selected from the group consisting of Si, Al, Ga, Mg, Ca, Sr, Ba, Sc, Y, Zr, Hf, Ti, Ta, W, Mo, Nb, V, Mn, Cr, Sm, Gd, Dy, Ho, Er, Yb, Lu; and the second conductive material is selected from the group consisting of Cu, Ni, Ag, Au, Pt, Pd, Zn.

18. The method of claim 16, wherein:
the first conductive material is aluminum;
the second conductive material is copper; and
the switching layer comprises aluminum oxide, copper oxide, and the silicon oxide.

19. The method of claim 16, wherein the second oxide comprises a diffused portion of the second conductive material of the first conductive layer.

* * * * *